US007041564B1

(12) United States Patent
Kalburge et al.

(10) Patent No.: US 7,041,564 B1
(45) Date of Patent: *May 9, 2006

(54) METHOD FOR FABRICATING A SELF-ALIGNED BIPOLAR TRANSISTOR

(75) Inventors: Amol Kalburge, Irvine, CA (US); Marco Racanelli, Santa Ana, CA (US)

(73) Assignee: Newport Fab, LLC, Newport Beach, CA (US)

( * ) Notice: Subject to any disclaimer, the term of this patent is extended or adjusted under 35 U.S.C. 154(b) by 36 days.

This patent is subject to a terminal disclaimer.

(21) Appl. No.: 10/870,900

(22) Filed: Jun. 17, 2004

Related U.S. Application Data

(62) Division of application No. 10/218,527, filed on Aug. 13, 2002, now Pat. No. 6,784,467.

(51) Int. Cl.
*H01L 21/8222* (2006.01)

(52) U.S. Cl. ........................................ 438/321; 438/367

(58) Field of Classification Search ...................... None
See application file for complete search history.

(56) References Cited

U.S. PATENT DOCUMENTS

| 4,885,614 | A | * | 12/1989 | Furukawa et al. ............ 257/76 |
| 5,093,272 | A | * | 3/1992 | Hoepfner et al. ........... 438/321 |
| 6,020,246 | A | * | 2/2000 | Koscielniak et al. ........ 438/366 |

* cited by examiner

*Primary Examiner*—Chandra Chaudhan
(74) *Attorney, Agent, or Firm*—Farjami & Farjami LLP

(57) ABSTRACT

According to one exemplary embodiment, a bipolar transistor comprises a base having a top surface. The bipolar transistor further comprises a sacrificial post which, in one exemplary embodiment, is situated between first and second link spacers. The bipolar transistor also comprises a conformal layer situated over the sacrificial post. The conformal layer may comprise silicon oxide, for example. According to this exemplary embodiment, the bipolar transistor further comprises a sacrificial planarizing layer situated over the conformal layer, the sacrificial post, and the base. The sacrificial planarizing layer has a first thickness in a first region between the first and second link spacers and a second thickness in a second region outside of the first and second link spacers, where the second thickness is generally greater than the first thickness. Another embodiment is a method that achieves the above-described bipolar transistor.

14 Claims, 6 Drawing Sheets

METHOD FOR FABRICATING A SELF-ALIGNED BIPOLAR TRANSISTOR

This is a divisional of application Ser. No. 10/218,527 filed Aug. 13, 2002.

This application hereby incorporates fully be reference a pending related United States patent application entitled "Method for Fabricating a Self-Aligned Emitter in a Bipolar Transistor" Ser. No. 09/721,344 filed Nov. 22, 2000 and assigned to the assignee of the present application.

BACKGROUND OF THE INVENTION

1. Field of the Invention

The present invention relates to the field of fabrication of semiconductor devices. More specifically, the invention relates to the fabrication of bipolar transistors.

2. Background Art

As modern electronic devices increase in speed while decreasing in size and price, semiconductor manufacturers are challenged to provide low-cost, high speed, and small size transistors for these devices. To meet this challenge, semiconductor manufacturers must accurately control the size of certain features that critically affect the performance of transistors on a semiconductor wafer, such as emitter widths of bipolar transistors. Furthermore, various parts of the bipolar transistor must be properly aligned to ensure that the bipolar transistor meets performance requirements. For example, the emitter and the extrinsic base implant in a heterojunction bipolar transistor (HBT) must be properly aligned to prevent an undesirable increase in base resistance.

In one conventional fabrication process for a bipolar transistor, such as an HBT, semiconductor manufacturers utilize a first photomask to control the bipolar transistor's emitter width, which is generally referred to as a critical dimension, or "CD." A second photomask, which must be properly aligned with the first photomask, is utilized to determine the boundaries of the heavily doped extrinsic base regions of the bipolar transistor. Misalignment of the two photomasks causes, among other things, the distance across the link base region of the bipolar transistor, i.e. the region between the base-emitter junction and the extrinsic base region, to vary in an unpredictable fashion. Because there is always a margin of error in the alignment of the two photomasks, the distance across the link base region must be increased to account for the misalignment. This results, for example, in an undesirable increase in base resistance. Additionally, in the two-photomask fabrication process described above, the first photomask must be accurately controlled to control the emitter width of the bipolar transistor. Also, misalignment of the two photomasks can cause an undesirable reduction in manufacturing yield, which can cause a corresponding increase in manufacturing cost.

Other fabrication processes and tools have been tried in attempts to solve the problem of aligning the link base and extrinsic base to the emitter in bipolar transistor devices. One approach requires the use of selective epitaxy along with the use of an inside spacer. Selective epitaxy presents a problem in that it is not currently used in high volume production of semiconductor devices. Selective epitaxy presents another problem in that selective epitaxial deposition occurs only on silicon regions and not on oxide regions. Since most process monitoring is done on oxide regions, selective epitaxy results in a substantial loss of process monitoring capability. Use of an inside spacer presents a further problem in that variability of emitter width is greater than with other methods, so some accuracy in control of emitter width is lost.

In addition, as feature sizes of bipolar devices are reduced, it is important and more difficult to achieve accurate control over the size of certain features, such as the emitter width of the bipolar transistor.

Thus, there is need in the art for a fabrication process for bipolar transistors which does not rely on the alignment of separate photomasks to form the link base region, the intrinsic base region, the base-emitter junction, and to implant the heavily doped extrinsic base region.

SUMMARY OF THE INVENTION

The present invention is directed to method for fabricating a self-aligned bipolar transistor and related structure. The present invention addresses and resolves the need in the art for a fabrication process for bipolar transistors which does not rely on the alignment of separate photomasks to form the link base region, the intrinsic base region, the base-emitter junction, and to implant the heavily doped extrinsic base region of the bipolar transistor.

According to one exemplary embodiment, a bipolar transistor comprises a base having a top surface. The bipolar transistor may be, for example, a heterojunction bipolar transistor, a silicon-germanium heterojunction bipolar transistor, or a silicon-germanium-carbon heterojunction bipolar transistor. The bipolar transistor further comprises a sacrificial post which, in one exemplary embodiment, is situated between first and second link spacers. The bipolar transistor also comprises a conformal layer situated over the sacrificial post. The conformal layer may comprise silicon oxide, for example.

According to this exemplary embodiment, the bipolar transistor further comprises a sacrificial planarizing layer situated over the conformal layer, the sacrificial post, and the base. The sacrificial planarizing layer may comprise, for example, an organic material such as an organic BARC ("bottom anti-reflective coating"). The sacrificial planarizing layer may have a thickness over the sacrificial post of between, for example, approximately 0.0 Angstroms and approximately 2500.0 Angstroms. The sacrificial planarizing layer has a first thickness in a first region between the first and second link spacers and a second thickness in a second region outside of the first and second link spacers, where the second thickness is generally greater than the first thickness. The second thickness may be, for example, between approximately 500.0 Angstroms and 3500.0 Angstroms. In another embodiment, the present invention is a method that achieves the above-described bipolar transistor. Other features and advantages of the present invention will become more readily apparent to those of ordinary skill in the art after reviewing the following detailed description and accompanying drawings.

DETAILED DESCRIPTION OF THE INVENTION

The present invention is directed to method for fabricating a self-aligned bipolar transistor and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings. Examples of some of the materials and processes discussed in the present application are disclosed in a pending related United States patent application entitled "Method for Fabricating a Self-Aligned Emitter in a Bipolar Transistor," Ser. No. 09/721,344, filed Nov. 22, 2000, and assigned to the assignee of the present application. The disclosure in that co-pending application is hereby incorporated fully by reference into the present application.

Figure 1:
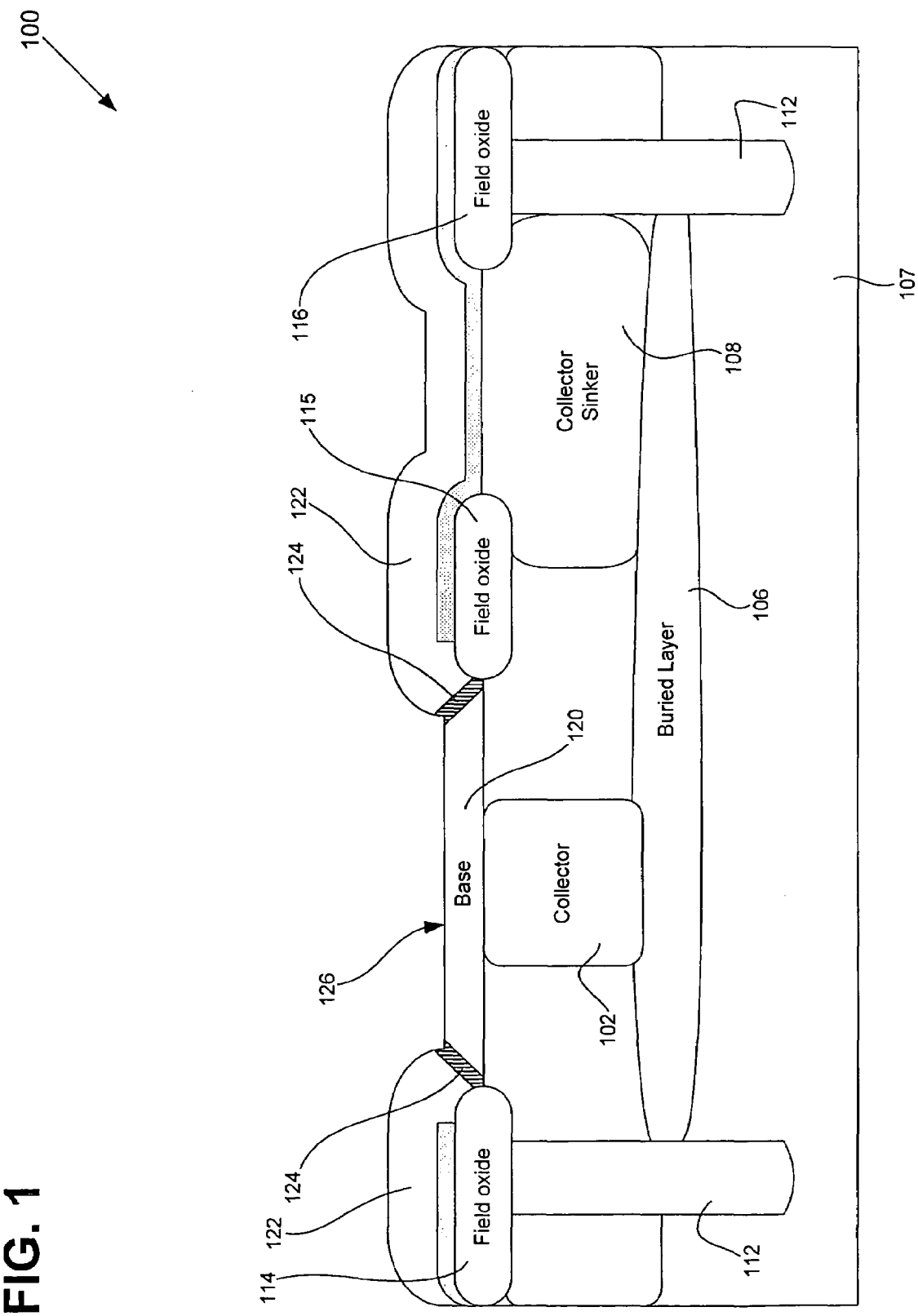
FIG. 1 illustrates a cross-sectional view of some of the features of an exemplary bipolar transistor prior to application of the steps taken to implement an embodiment of the present invention.

FIG. 1 shows exemplary structure 100, which is utilized to describe the present invention. Certain details and features have been left out of FIG. 1, which are apparent to a person of ordinary skill in the art. Structure 100 includes collector 102 and base 120 for a bipolar transistor. The present invention applies, in general, to any bipolar transistor, including a heterojunction bipolar transistor ("HBT"). For example, the present invention applies to NPN or PNP HBTs comprising silicon, silicon-germanium, gallium-arsenide, or other materials. In particular, the present invention applies to silicon-germanium-carbon HBTs where carbon is used as a diffusion suppressant. However, the present application makes specific reference to a silicon-germanium ("SiGe") NPN bipolar transistor as an aid to describe an embodiment of the present invention. In the present embodiment, collector 102 is N-type single crystal silicon that can be formed using a dopant diffusion process in a manner known in the art. In the present embodiment, base 120 is P-type SiGe single crystal that might be deposited epitaxially in a low-pressure chemical vapor deposition ("LPCVD") process. Base 120 may be implanted with boron ions to achieve the aforementioned P-type doping. As seen in FIG. 1, base 120 is situated on top of, and forms a junction with, collector 102. In the present embodiment, base contact 122 is polycrystalline SiGe that may be deposited epitaxially in a LPCVD process. Base 120 and base contact 122 connect with each other at interface 124 between the contact polycrystalline material and the base single crystal material. Base 120 has a top surface 126.

As seen in FIG. 1, buried layer 106, which is composed of N+ type material, i.e. it is relatively heavily doped N-type material, is formed in silicon substrate 107 in a manner known in the art. Collector sinker 108, also comprised of N+ type material, is formed by diffusion of heavily concentrated dopants from the surface of collector sinker 108 down to buried layer 106. Buried layer 106, along with collector sinker 108, provide a low resistance electrical pathway from collector 102 through buried layer 106 and collector sinker 108 to a collector contact (the collector contact is not shown in FIG. 1). Deep trenches 112 and field oxide isolation regions 114, 115, and 116 may be composed of silicon dioxide ($SiO_2$) material and are formed in a manner known in the art. Deep trenches 112 and field oxide isolation regions 114, 115, and 116 provide electrical isolation from other devices on silicon substrate 107 in a manner known in the art. Thus, FIG. 1 shows that structure 100 includes several features and components used to form a bipolar transistor at a stage prior to formation of an emitter comprised of N-type polycrystalline silicon above base 120.

Figure 2:
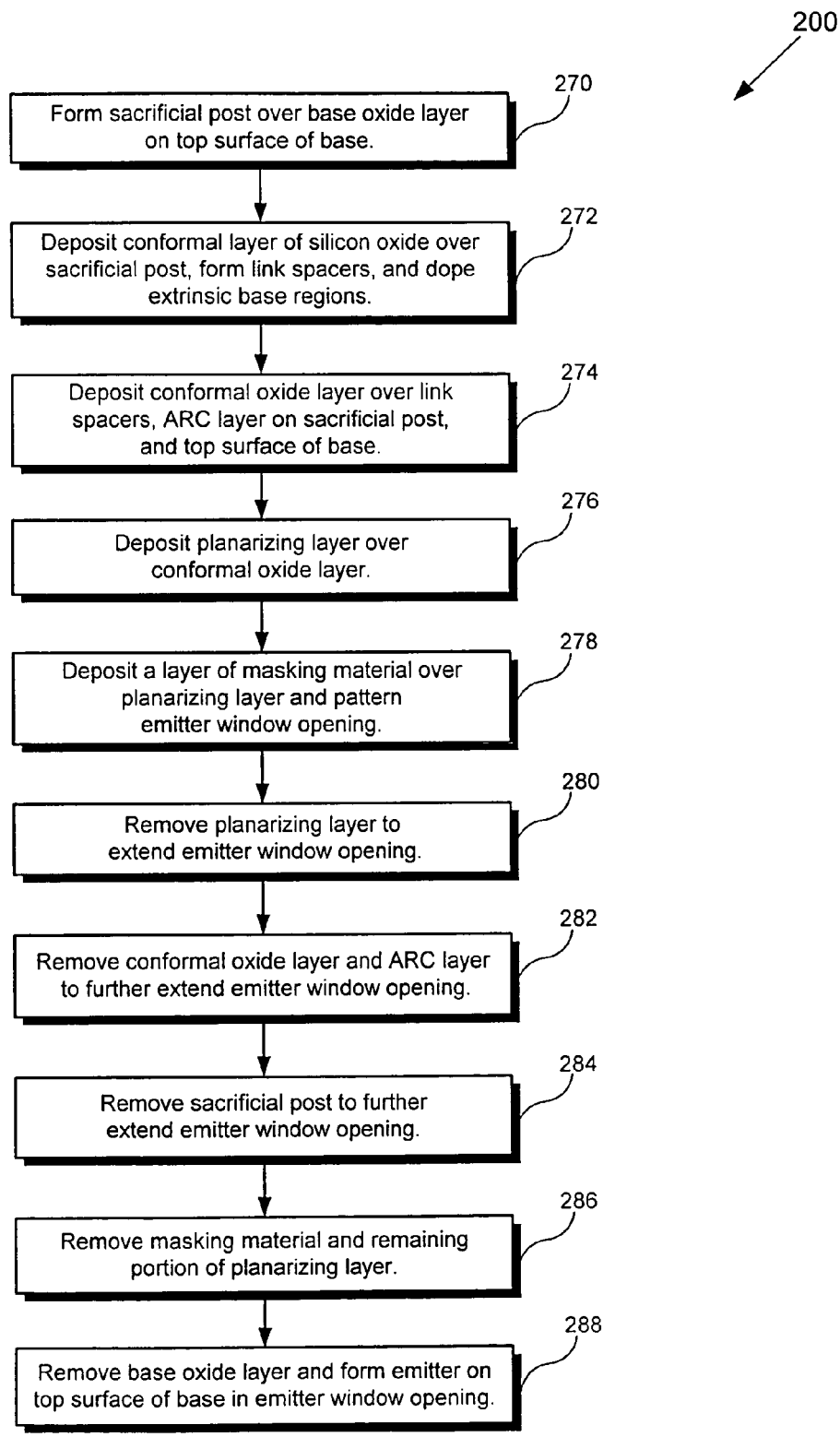
FIG. 2 shows a flowchart illustrating the steps taken to implement an embodiment of the present invention.

FIG. 2 shows flowchart 200, which describes the steps, according to one embodiment of the present invention, in the processing of a wafer that includes structure 100. Certain details and features have been left out of flowchart 200 that are apparent to a person of ordinary skill in the art. For example, a step may consist of one or more substeps or may involve specialized equipment or materials, as known in the art.

Steps 270 through 288 indicated in flowchart 200 are sufficient to describe one embodiment of the present invention, other embodiments of the invention may utilize steps different from those shown in flowchart 200. It is noted that the processing steps shown in flowchart 200 are performed on a wafer, which, prior to step 270, includes structure 100 shown in FIG. 1. In particular, the wafer includes top surface 126 of base 120 on which formation of an emitter comprised of N-type polycrystalline silicon is to take place in an "emitter window opening."

Figure 3A:
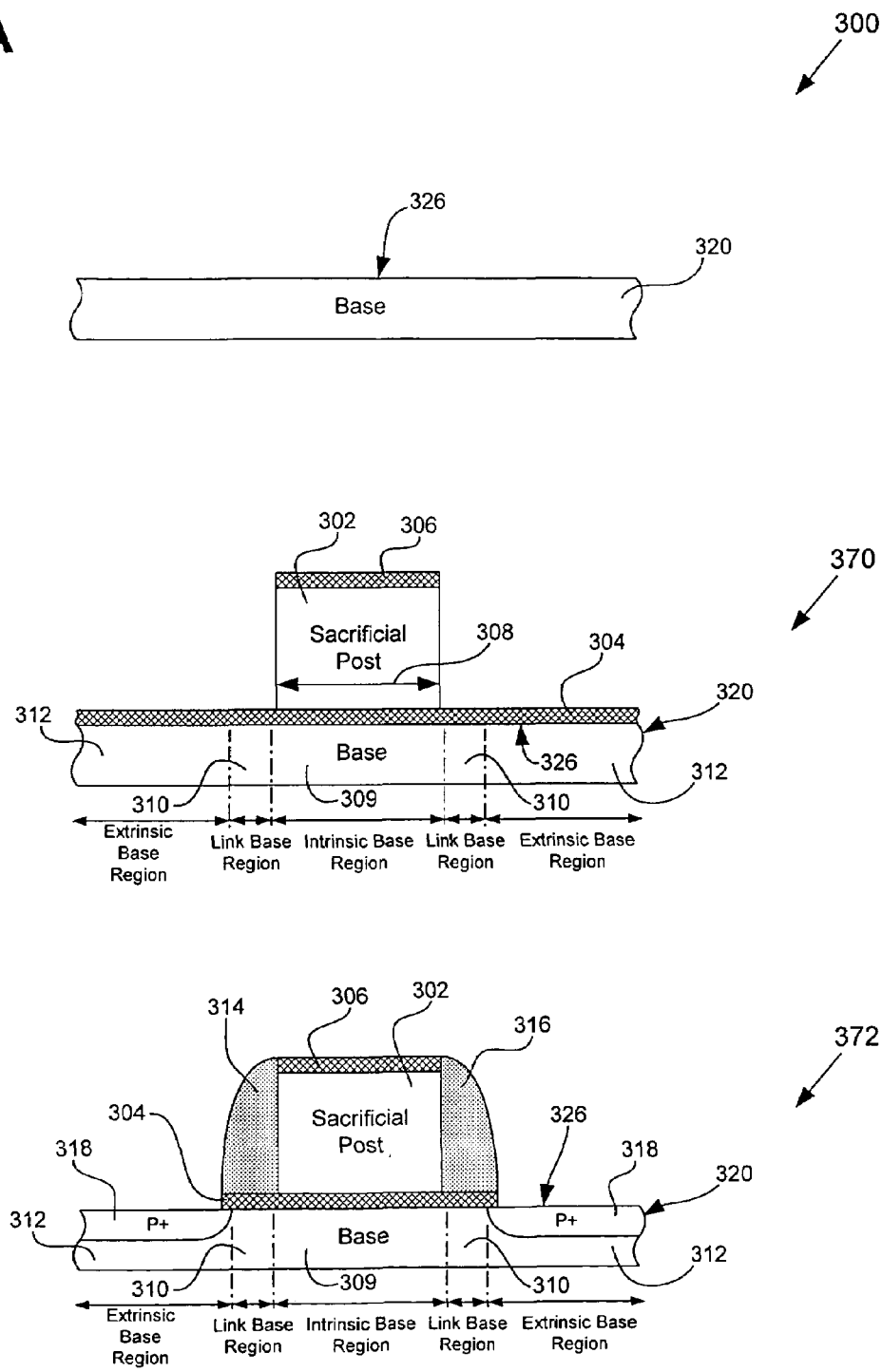
FIG. 3A illustrates cross-sectional views, which include portions of a wafer processed according to an embodiment of the invention, corresponding to certain steps of FIG. 2.

Referring now to FIG. 3A, structure 300 of FIG. 3A shows a portion of structure 100 of FIG. 1. Base 120 and top surface 126 of structure 100 are shown in structure 300 as base 320 and top surface 326, respectively. For simplicity, other features such as base contact 122, interface 124, collector 102, buried layer 106, silicon substrate 107, collector sinker 108, deep trenches 112, and field oxide regions 114, 115, and 116, are not shown in structure 300. Structure 300 thus shows the portion of a wafer including top surface 326 of base 320, on which the formation of an emitter comprised of N-type polycrystalline silicon is to take place in an emitter window opening, before processing the wafer according to one embodiment of the invention shown in flowchart 200 of FIG. 2. In particular, structure 300 shows a portion of the wafer before processing step 270 of flowchart 200.

Referring to FIGS. 3A, 3B, 3C, and 3D, structures 370, 372, 374, 376, 378, 380, 382, 384, 386, and 388 illustrate the result of performing, on structure 300, steps 270, 272, 274, 276, 278, 280, 282, 284, 286, and 288 of flowchart 200 of FIG. 2, respectively. For example, structure 370 shows structure 300 after processing step 270, structure 372 shows structure 370 after the processing of step 272, and so forth.

Continuing with step 270 in FIG. 2 and structure 370 in FIG. 3A, step 270 of flowchart 200 comprises the formation of sacrificial post 302 over base oxide layer 304 on top surface 324 of base 320. Base 320 comprises intrinsic base region 309, link base regions 310, and extrinsic base regions 312. Sacrificial post 302 may be formed by patterning and etching a layer of polycrystalline silicon, which may be deposited over base oxide layer 304 by chemical vapor deposition ("CVD"), as known in the art. Although polycrystalline silicon is used in one embodiment of the invention described here, it is manifest that any layer of material that is suitable for accurate patterning using a photomask or other patterning techniques may be used. The suitable material forms a temporary layer of material, i.e. sacrificial post 302, which is etched away prior to formation of an emitter at a later step in the process. To provide greater control and to achieve the smallest possible emitter width, anti-reflective coating ("ARC") layer 306 can be depositing over the layer of polycrystalline silicon before patterning sacrificial post 302 with photoresist. For example, ARC layer 306 may be composed of silicon oxynitride. In one embodiment, ARC layer 306 may not be used. The height of sacrificial post 302 can be, for example, between approximately 500.0 to 3500.0 Angstroms.

As seen below, sacrificial post width 308 determines the width of the emitter of the bipolar transistor formed as the result of the sequence of steps according to one embodiment of the present invention. Base oxide layer 304 prevents damage to base 320 during the etching used to form sacrificial post 302. Base oxide layer 304 may be formed by depositing a layer of silicon oxide, which may be deposited in a PECVD process at a temperature of approximately 350.0 to 450.0° C., for example. In one embodiment, base oxide layer 312 has a thickness of approximately 80.0 Angstroms. In one embodiment, link base regions 310 may be lightly doped by ion implantation to reduce or control the resistance of link base regions 310. The ion implantation doping can be performed through base oxide layer 304, and uses sacrificial post 302 as a mask. It is noted that doping of link base regions 310 is, thus, self-aligned; that is, the doping of link base regions 310 is defined by the edge of sacrificial post 302, and does not depend on the alignment of a photomask. The result of step 270 of flowchart 200 is illustrated by structure 370 in FIG. 3A.

Referring to step 272 in FIG. 2 and structure 372 in FIG. 3A, at step 272 of flowchart 200, a conformal layer of dielectric such as silicon oxide is deposited over sacrificial post 302. For example, silicon oxide can be deposited at low temperature and pressure using a plasma-enhanced chemical vapor deposition ("PECVD") process. The deposited conformal layer of silicon oxide is "etched back" to form a pair of oxide spacers, i.e. link spacers 314 and 316. During the "etch back" process portions of base oxide layer 304 outside of link spacers 314 and 316 are also etched away. For example, link spacers 314 and 316 can be formed by anisotropically etching the conformal layer of silicon oxide using a chlorine based etchant, e.g. a $CF_4/CHF_3$ etch. The edge positions of link spacers 314 and 316, which also determine the boundaries of extrinsic base regions 312, are determined by control of deposition thickness of the conformal silicon oxide layer prior to etch back. The height of link spacers 314 and 316 may be controlled, for example, by the height of sacrificial post 302.

After link spacers 314 and 316 are formed, extrinsic base regions 312 are doped by ion implantation to reduce the resistance of extrinsic base regions 312. The ion implantation doping uses sacrificial post 302 and link spacers 314 and 316 as a mask. Thus, doping of extrinsic base regions 312 is self-aligned, since the doping of exposed extrinsic base regions 312 is defined by the edge of link spacers 314 and 316, and does not depend on the alignment of a photomask. Ion implantation of extrinsic base regions 312 results in heavily doped P+ implanted regions 318 within extrinsic base regions 312. In one embodiment, the dopant used to form implanted regions 318 can be boron. Referring to FIG. 3A, the result of step 272 of flowchart 200 is illustrated by structure 372.

Figure 3B:
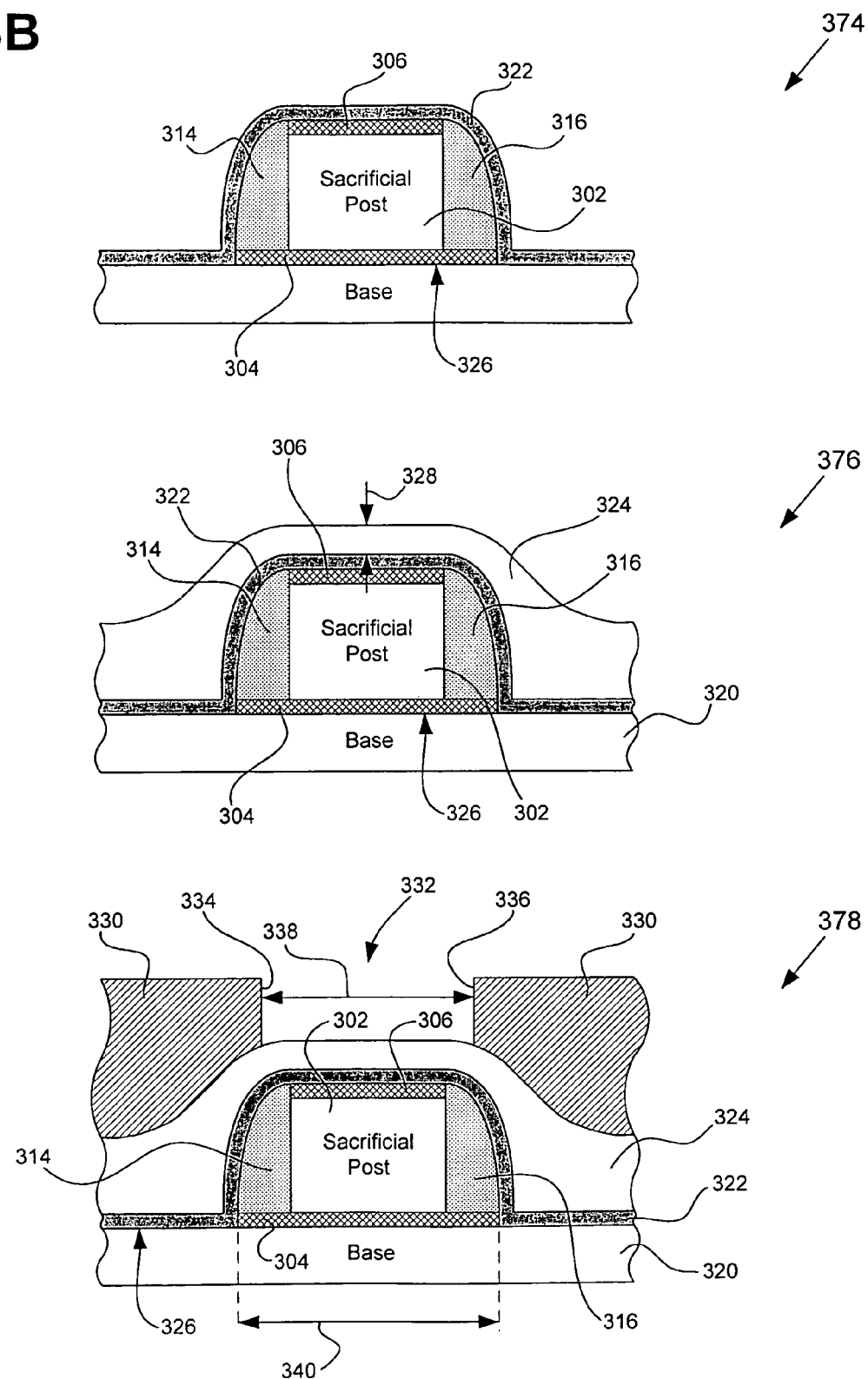
FIG. 3B illustrates cross-sectional views, which include portions of a wafer processed according to an embodiment of the invention, corresponding to certain steps of FIG. 2.

Continuing with step 274 in FIG. 2 and structure 374 in FIG. 3B, at step 274 of flowchart 200, conformal oxide layer 322 is deposited over ARC layer 306 on sacrificial post 302, link spacers 314 and 316, and top surface 326 of base 320. Conformal oxide layer 322, for example, may comprise silicon oxide or other dielectric. Referring to FIG. 3B, the result of step 274 of flowchart 200 is illustrated by structure 374.

Continuing with step 276 in FIG. 2 and structure 376 in FIG. 3B, at step 276 of flowchart 200, sacrificial planarizing layer 324 is deposited over conformal oxide layer 322. In the present embodiment, sacrificial planarizing layer 324 is deposited over conformal oxide layer 322 using a spin-on process. Sacrificial planarizing layer 324 exhibits a "planarizing" property by coating tall features of structure 376, such as sacrificial post 302 and link spacers 314 and 316, thinly, while providing a thicker coating of material over deeper features close to sacrificial post 302 and link spacers 314 and 316. For example, thickness 328 of sacrificial planarizing layer 324 over sacrificial post 302 can be between approximately 0.0 Angstroms and approximately 2500.0 Angstroms. In contrast, the thickness of sacrificial planarizing layer 324 over deeper features of structure 376, such as the regions outside of the sacrificial post and the link spacers, can be approximately 500.0 to 3500.0 Angstroms or even greater depending on the height of sacrificial post 302. In the present embodiment, the above "planarizing" property exhibited by sacrificial planarizing layer 324 occurs as a result of the material sacrificial planarizing layer 324 comprises and the spin-on process utilized to deposit sacrificial planarizing layer 324. For example, the material sacrificial planarizing layer 324 comprises must have a sufficiently low viscosity to enable the material to flow during the spin-on process utilized to deposit sacrificial planarizing layer 324.

Sacrificial planarizing layer 324 can be an organic material comprising, for example, carbon, hydrogen, oxygen, and some dopants. In one embodiment, sacrificial planarizing layer 324 can comprise an organic material, such as an organic BARC. In one embodiment, sacrificial planarizing layer 324 may comprise an organic material that allows sacrificial planarizing layer 324 to act as an anti-reflective coating layer. In one embodiment, sacrificial planarizing layer 324 can be an organic material that may be deposited by an evaporation process. In such embodiment, the deposited organic material may be heated to cause the organic material to flow away from high features of structure 376 and collect in deeper regions of structure 376. Referring to FIG. 3B, the result of step 276 of flowchart 200 is illustrated by structure 376.

Continuing with step 278 in FIG. 2 and structure 378 in FIG. 3B, at step 278 of flowchart 200, mask 330 is deposited on sacrificial planarizing layer 324 and emitter window opening 332 is patterned in mask 330. In the present embodiment, mask 330 comprises photoresist. In another embodiment, mask 330 may comprise another suitable material as is known by a person of ordinary skill in the art. As described above, sacrificial planarizing layer 324 provides a thin layer of material over sacrificial post 302 and a thicker layer of material over deeper regions of structure 378 adjacent to link spacers 314 and 316. Thus, emitter window opening width 338 can be greater than the distance between the outside edges of link spacers 314 and 316, i.e. width 340, since sacrificial post 302 and link spacers 314 and 316 will be exposed first during a subsequent etching process, while deeper regions of structure 378 will remain protected by the thicker layer of material provided by sacrificial planarizing layer 324. In one embodiment, emitter window opening width 338 can be less than width 340, i.e. the distance between the outside edges of link spacers 314 and 316.

Thus, the present invention does not require edges 334 and 336 of emitter window opening 332 to be situated over link spacers 314 and 316, respectively, so that link spacers 314 and 316 can protect the region of structure 378 beneath link spacers 314 and 316 during subsequent etching steps. In the present embodiment, as thickness 328 of sacrificial planarizing layer 324 is decreased to a minimal thickness of approximately 100.0 Angstroms, the present invention advantageously achieves increased flexibility in the width of emitter window opening 332. Thus, by providing an emitter window opening that can be made sufficiently large, the present invention advantageously achieves an emitter window opening that requires minimal dimensional and alignment accuracy. In other words, critical dimension control of emitter window opening 332 is relaxed as emitter window opening width 338 is increased.

Moreover, absent the technique of the present invention, if the center of emitter window opening 332 is not properly aligned with the center of sacrificial post 302, the resulting misalignment can create undesirable device properties, which can reduce manufacturing yield. For example, absent the present invention's technique, misalignment of the center of emitter window opening 332 and the center of sacrificial post 302 can cause edge 334 or edge 336 of emitter window opening 332 to be situated too close to the area above sacrificial post 302, which can create undesirable device properties and cause decreased manufacturing yield. However, according to the present invention, the width of emitter window opening 332 can be increased sufficiently to accommodate alignment error between the center of emitter window opening 332 and the center of sacrificial post 302. Thus, the present invention achieves a bipolar transistor having improved manufacturability, which advantageously results in increased manufacturing yield.

By minimizing thickness 328 of sacrificial planarizing layer 324 over sacrificial post 302 and providing a sufficiently large emitter window opening width, the present invention achieves an emitter window opening that is practically self-aligning over sacrificial post 302. In one embodiment, thickness 328 of sacrificial planarizing layer 324 over sacrificial post 302 can be reduced to an appropriate thickness such that mask 330 is not required. In such embodiment, thickness 328, for example, may be approximately 10.0 Angstroms or less. Thus, since the thin sacrificial planarizing layer 324 situated over sacrificial post 302 is etched first in a subsequent etching step, the resulting emitter window opening is self-aligned over sacrificial post 302. In other words, no mask is required to align the emitter window opening over sacrificial post 302. Referring to FIG. 3B, the result of step 278 of flowchart 200 is illustrated by structure 378.

Figure 3C:
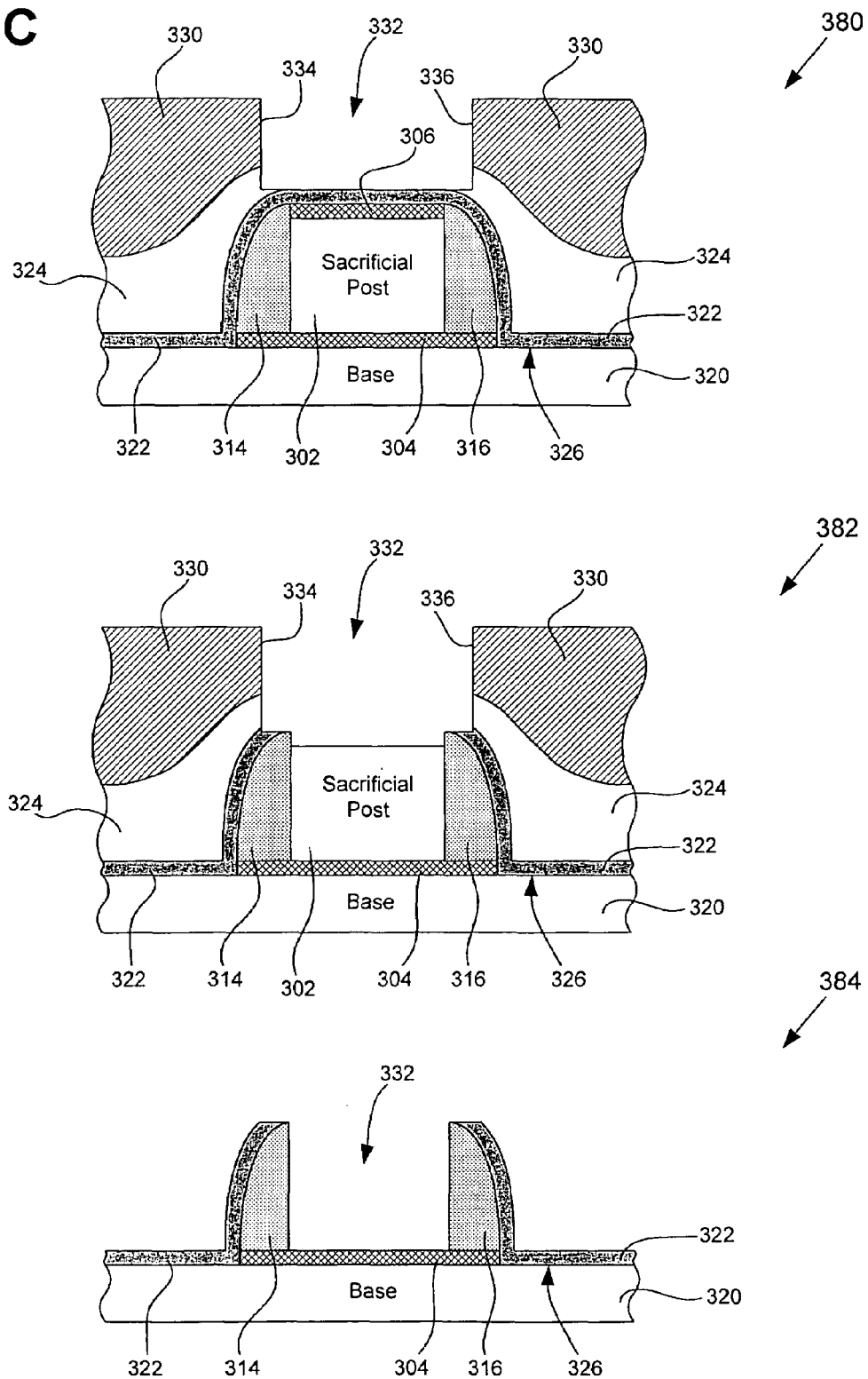
FIG. 3C illustrates cross-sectional views, which include portions of a wafer processed according to an embodiment of the invention, corresponding to certain steps of FIG. 2.

Continuing with step 280 in FIG. 2 and structure 380 in FIG. 3C, at step 280 of flowchart 200, sacrificial planarizing layer 324 is removed in emitter window opening 332 to expose conformal oxide layer 322 and extend emitter window opening 332. Sacrificial planarizing layer 324 may be removed using, for example, a plasma etching and/or a sulfuric wet etch process which are selective to conformal oxide layer 322. Referring to FIG. 3C, the result of step 280 of flowchart 200 is illustrated by structure 380.

Continuing with step 282 in FIG. 2 and structure 382 in FIG. 3C, at step 282 of flowchart 200, conformal oxide layer 322 and ARC layer 306 are removed in emitter window opening 332 to expose sacrificial post 302 and further extend emitter window opening 332. For example, conformal oxide layer 322 and ARC layer 306 may be removed using a reactive ion etch stopping on sacrificial post 302. Referring to FIG. 3C, the result of step 282 of flowchart 200 is illustrated by structure 382.

Continuing with step 284 in FIG. 2 and structure 384 in FIG. 3C, at step 284 of flowchart 200, sacrificial post 302 is removed in emitter window opening 332 to expose base oxide layer 304. Sacrificial post 302 may be removed, for example, using a chlorine based etch that stops on base oxide layer 304. Referring to FIG. 3C, the result of step 284 of flowchart 200 is illustrated by structure 384.

Figure 3D:
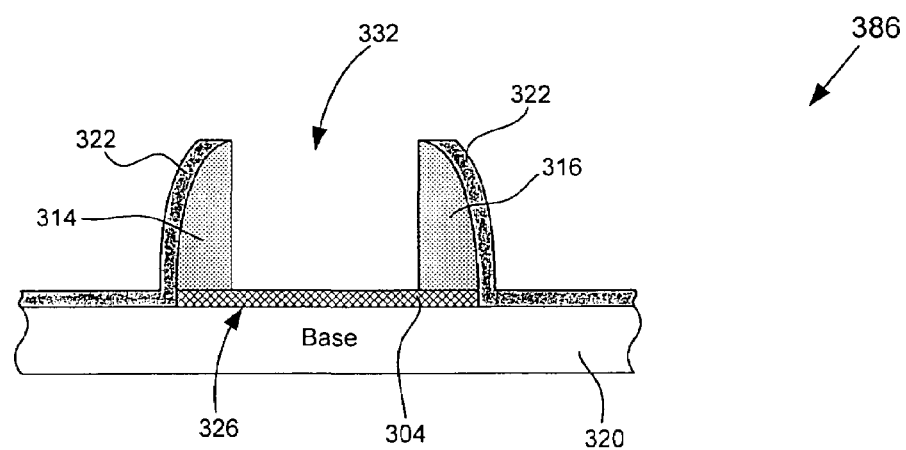
FIG. 3D illustrates cross-sectional views, which include portions of a wafer processed according to an embodiment of the invention, corresponding to certain steps of FIG. 2.
Figure 3D:
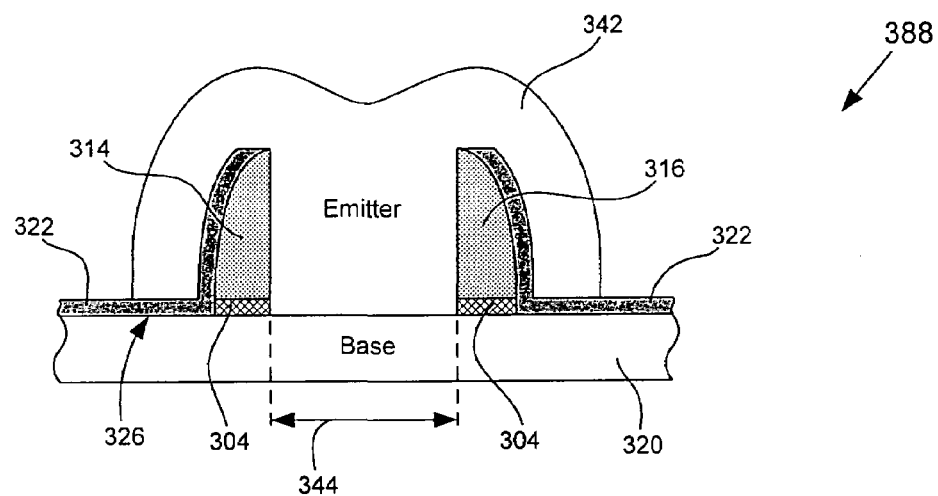

Continuing with step 286 in FIG. 2 and structure 386 in FIG. 3D, at step 286 of flowchart 200, mask 330 and remaining portion of sacrificial planarizing layer 324 are removed. Mask 330 and sacrificial planarizing layer 324 are removed in a two step process. In step one, mask 330 may be removed, for example, using a plasma etch in a downstream microwave plasma process as known in the art. The plasma etch used in step one also removes sacrificial planarizing layer 334. In step two, any remaining sacrificial planarizing layer 334 material can be removed, for example, using a sulfuric acid wet strip process as known in the art. Referring to FIG. 3D, the result of step 286 of flowchart 200 is illustrated by structure 386.

Referring to step 288 in FIG. 2 and structure 388 in FIG. 3D, at step 288 of flowchart 200, the portion of base oxide layer 304 situated between link spacer 314 and link spacer 316 is removed to complete formation of emitter window opening 332, and emitter 342 is then formed in emitter window opening 332. Base oxide layer 304 may be removed, for example, with a wet strip such as a hydrogen fluoride ("HF") dip. An HF dip will also smooth out the top of link spacers 314 and 316, which have been roughened by the previous etching processes used to remove conformal oxide layer 322, ARC layer 306, and sacrificial post 302. Next, emitter 342 is formed by depositing a polycrystalline material on top surface 326 of base 320 in emitter window opening 332. In one embodiment, emitter 342 can comprise N-type polycrystalline silicon. Emitter width 344 of emitter 342 is substantially equal to sacrificial post width 308 in FIG. 3A. Also, emitter 342 is self-aligned by link spacers 314 and 316 to extrinsic base regions 312. Subsequent steps of patterning emitter 342, and forming contacts, as well as other steps, can be performed as known in the art.

It is appreciated by the above detailed disclosure that the invention provides method for fabrication of a self-aligned bipolar transistor achieving improved manufacturability by providing an emitter window opening requiring minimal critical dimension control and having increased tolerance for misalignment error. Although the invention is described as applied to the fabrication of a bipolar transistor, it will be readily apparent to a person of ordinary skill in the art how to apply the invention in a similar situation where improved alignment tolerance and a reduction in critical dimension control is desirable.

From the description of the above invention it is evident that various techniques can be used for implementing the concepts of the present invention without departing from its scope and spirit. Moreover, while the invention has been described with specific reference to certain embodiments, a person of ordinary skills in the art would recognize that changes made in form and detail without departing from the spirit and scope of the invention. The described embodiments are to be considered in all respects as illustrative and not restrictive. Therefore, it should be understood that the invention is not limited to the particular embodiments described herein, but is capable of many rearrangements, modifications, and substitutions without departing from the scope of the invention.

Thus, method for fabricating a self-aligned bipolar transistor and related structure have been described.

The invention claimed is:

1. A method for fabricating a bipolar transistor, said method comprising steps of:
    fabricating a sacrificial post on a top surface of a base;
    forming a conforming layer over said sacrificial post;
    depositing a sacrificial planarizing layer over said conformal layer, said sacrificial post, and said base;
    wherein said sacrificial post is fabricated prior to formation of an emitter of said bipolar transistor.

2. The method of claim 1 further comprising a step of fabricating first and second link spacers on, respectively, first and second sides of said sacrificial post prior to said step of forming said conformal layer.

3. The method of claim 1 further comprising steps of:
    depositing a mask over said sacrificial planarizing layer;
    patterning an emitter window opening in said mask.

4. The method of claim 1 wherein said sacrificial planarizing layer comprises an organic material.

5. The method of claim 4 further comprising a step of removing said sacrificial planarizing layer by a process selected from the group consisting of a plasma etch and a sulfuric wet etch.

6. The method of claim 4 wherein said organic material is an organic BARC.

7. The method of claim 1 wherein said sacrificial planarizing layer is deposited using a spin-on process.

8. The method of claim 3 wherein said emitter window opening has a width greater than a width of said sacrificial post.

9. The method of claim 3 wherein said emitter window opening has a width smaller than a width of said sacrificial post.

10. The method of claim 3 wherein said emitter window opening has a width approximately equal to a width of said sacrificial post.

11. The method of claim 1 further comprising a step of etching an emitter window opening in said sacrificial planarizing layer.

12. The method of claim 1 wherein said bipolar transistor is a silicon-germanium heterojunction bipolar transistor.

13. The method of claim 1 wherein said bipolar transistor is a silicon-germanium-carbon heterojunction bipolar transistor.

14. A method for fabricating a bipolar transistor, said method comprising steps of:
    fabricating a sacrificial post on a top surface of a base;
    fabricating first and second link spacers on, respectively, first and second sides of said sacrificial;
    forming a conforming layer over said sacrificial post and said first and second link spacers;
    depositing a sacrificial planarizing layer over said conformal layer, said sacrificial post, said first and second link spacers, and said base.

* * * * *